(12) United States Patent
Bruel (10) Patent No.: US 7,332,030 B2
(45) Date of Patent: Feb. 19, 2008

(54) METHOD OF TREATING A PART IN ORDER TO ALTER AT LEAST ONE OF THE PROPERTIES THEREOF

(76) Inventor: Michel Bruel, Presvert n 9, 38113 Veurey-Vorioize (FR)

( * ) Notice: Subject to any disclaimer, the term of this patent is extended or adjusted under 35 U.S.C. 154(b) by 416 days.

(21) Appl. No.: 10/472,441

(22) PCT Filed: Jan. 15, 2003

(86) PCT No.: PCT/FR03/00119

§ 371 (c)(1),
(2), (4) Date: Aug. 25, 2004

(87) PCT Pub. No.: WO03/060182

PCT Pub. Date: Jul. 24, 2003

(65) Prior Publication Data

US 2005/0016837 A1    Jan. 27, 2005

(30) Foreign Application Priority Data

Jan. 16, 2002 (FR) .................................. 02 00461

(51) Int. Cl.
*C30B 23/02* (2006.01)
(52) U.S. Cl. ............................ 117/91; 117/86; 117/92; 117/94; 117/95; 117/2; 117/3
(58) Field of Classification Search ................. 117/86, 117/91, 92, 94, 95, 2, 3
See application file for complete search history.

(56) References Cited

U.S. PATENT DOCUMENTS 3,086,856 A * 4/1963 Siebertz ....................... 117/44
5,264,072 A * 11/1993 Mukai .......................... 117/43

(Continued)

FOREIGN PATENT DOCUMENTS

GB        2100057      * 12/1982

OTHER PUBLICATIONS

Groszhans I et al:, "Synthesis of buried silicon oxide layers by water plasma immersion implantation", Nuclear Instruments & Methods in Physics Research, Section—B: Beam Interactions with Materials and Atoms, North-Holland Publishing Company. Amsterdam, NL, vol. 155, No. 1-2, Jul. 1, 1999, pp. 67-74, XP004179775, ISSN: 0168-583X, p. 68, 2.Experimental conditions.

*Primary Examiner*—Robert Kunemund
(74) *Attorney, Agent, or Firm*—Young & Thompson (57) ABSTRACT

Process for the treatment of a component, at least one zone to be treated of which located in the depth of this component at a certain distance from the surface thereof, has at least one property that can be modified when this zone is subjected to a thermal energy density above a specified treatment level, comprises: placing the component to be treated at a thermal energy level below the specified level; and subjecting, through its aforementioned surface, for a specified time and in the form of at least one pulse, the component to a power flux generated by a particle emission unit, this emission unit being regulated so as to produce a thermal energy density that is concentrated on or has a localized maximum in the zone to be treated and reaching, in at least part of this zone, a level above the specified treatment level.

47 Claims, 8 Drawing Sheets

U.S. PATENT DOCUMENTS

| | | |
|---|---|---|
| 5,900,443 A | 5/1999 | Stinnett et al. |
| 5,985,742 A | 11/1999 | Henley et al. |
| 6,335,535 B1 * | 1/2002 | Miyake et al. ......... 250/492.21 |
| 6,656,270 B2 * | 12/2003 | Chung ......................... 117/89 |
| 7,125,451 B2 * | 10/2006 | Hartzell ....................... 117/43 |

* cited by examiner

FIG_1

FIG_3

FIG_4

FIG_6

FIG_7

METHOD OF TREATING A PART IN ORDER TO ALTER AT LEAST ONE OF THE PROPERTIES THEREOF

The invention relates to the general technical field of the treatment of materials.

PRIOR ART

In the prior art, there are various types of processes for treating the surface of components, the objective of which is to convert the physical and/or physico-chemical properties and/or the composition and/or the relief of a surface layer of the material. In these processes, the treatment affects the surface and possibly a thickness of the material lying between the surface and a certain depth.

Among these surface treatment processes are, for example, processes that use the deposition of thin films, chemical or mechanical treatments, surface-localized heat treatments, bombardment by particles or by photons and treatments that combine one or other of these processes. Whatever the type of treatment used, the objective is to affect the material on its surface and in a layer flush with the surface.

Some of these processes make use, at least in part, of an increase in the thermal energy (i.e. the energy associated with raising the temperature and/or the energy associated with phase changes and/or chemical reactions), which is located at the surface and in a layer that includes the surface, as driving force for converting the properties of the material on the surface. Thus, to produce such increases in thermal energy, energy is deposited locally in the surface layer by means of laser beams, electron beams or ion beams.

United States patent US-RE-036760 discloses a surface treatment process in which an ion beam is used repeatedly to treat the surface of a material.

U.S. Pat. No. 6,086,726 discloses a method of modifying a surface and comprises the deposition of a coating on the surface of a material. This surface thus coated is then subjected to an ion beam characterized by a number of pulses, an ion type and a fluence level.

U.S. Pat. No. 6,049,162 discloses an example of an electron beam source and its use for surface treatment.

U.S. Pat. No. 4,927,992 discloses a method of manufacturing articles from metal powder using a focused particle beam having an energy density sufficient to melt the powder. This beam constructs the article in question layer by layer, by melting a layer of powder and the upper part of the underlying substrate at the points where the beam passes. After cooling, the melted layer of powder becomes the new substrate. Powder is fed in so that the beam always sees a layer of powder of sufficient thickness. The article is thus constructed layer by layer.

U.S. Pat. No. 4,370,175 discloses a method of manufacturing photovoltaic cells, in which a p/n junction is created by implantation and the material of the surface crust is annealed by means of a pulsed laser beam whose wavelength lies in the ultraviolet, with a pulse energy of at least two joules.

U.S. Pat. No. 4,370,176 discloses a process in which a substrate is bombarded with particles of a doping material so as to be able to produce local surface liquefaction of the substrate, so that, after resolidification, the defects created in the surface crust by the bombardment are removed and so that the particles can be positioned in substitutional sites completely integrated into the crystal lattice of the substrate.

U.S. Pat. No. 5,918,140 discloses a process in which a thin layer of dopant atoms is deposited and then melted down to a desired depth by means of a laser impulse or an ion beam.

U.S. Pat. No. 5,445,689 discloses a process in which an ion beam is used to melt the surface of a material so as to change its structure and thus increase its corrosion resistance. Optionally, the material is coated before the ion beam treatment with a film capable of forming an alloy with the material.

In the prior art, there are also processes whose objective is to modify a material in a layer located in the depth, below the surface, in which the mechanism of transforming the physical properties is essentially due to the introduction of particles into the material.

This is the case, for example, with the technology called SIMOX for producing silicon-on-insulator substrates where the introduction of oxygen atoms into a silicon material makes it possible, by the oxygen and silicon combining, to produce a buried $SiO_2$ layer. This process is described in the following reference: *"Silicon-on-Insulator Technology"*, MRS Bulletin, December 1998, Volume 23, No. 12 (a publication of the Materials Research Society).

In this reference, there is also a description of the process called "SMART-CUT" that uses particles to weaken the material because of the defects created by the penetration of these particles into the material and/or-because of the interaction of these defects with the atoms arising from the implanted particles.

French patents FR-A-9111491, FR-A-9315563, FR-A-9600852 and FR-A-9606086 disclose various processes that cause a material to be weakened in the depth, making it possible to cut off thin films of said material. These processes use hydrogen or rare-gas ion implantation possibly combined with one or more subsequent heat treatments in order to weaken the material at a depth close to the depth of penetration of the ions.

In the above processes, it is attempted, during the ion implantation phase that requires a specified temperature range, to prevent the temperature from rising above a value of around 400° C. so that the implanted species do not escape from the material. In these processes that allow layers with a thickness of around 1 to 2 microns to be produced in the silicon, even if the amount of energy used is high (around 1500 to 2000 joules per square centimeter ($J/cm^2$)), this energy is applied for long periods (measuring in minutes) so that the mean power is low enough for there to be no zone of high thermal energy density and so that, by natural means of cooling or with conventional cooling means on the implantation machines, the temperature of the implanted material remains moderate.

Because of this very high amount of energy, the cost of the process is high. These techniques are in fact suitable for the production of thin films (up to about 2 microns) for very high value-added applications. However, they are not suitable for producing thicker films, since the amount of energy needed increases with the thicknesses and for example, reaches 10 000 to 20 000 $J/cm^2$ for a thickness of 10 microns, thereby very considerably increasing the cost of the process.

There also exists in the prior art, processes in which materials are produced that have, in the depth, a zone that is selectively absorbent relative to the power flux used. For example, in the case of a laser beam, a structure is produced that has, in the depth, a layer that absorbs at the wavelength of the laser, whereas the upper part is substantially transparent or weakly absorbent at this wavelength.

More particularly, European patent EP-A-0 924 769 discloses a process in which structures are fabricated by the successive stacking of several layers, one of which is capable of allowing separation from the material at this layer. One particular example is indicated in which a layer rich in hydrogen also has the property of being selectively absorbent relative to the rest of the material in such a way that a laser beam can deposit its energy in this layer without significantly depositing energy in the other layers.

This manner of operating has the drawback and the limitation of requiring the fabrication of structured materials by the stacking of layers with, located at the required depth, a layer that is selectively absorbent relative to the power flux.

SUMMARY OF THE INVENTION

The present invention relates to a process for the treatment of a component with a view to modifying at least one of its properties, this process being such that the invention is completely different from the prior art described above, both as regards the technical problems that it poses and as regards the means that it employs and the results that it allows to be obtained.

One objective of the present invention is to provide a treatment process for modifying at least one property of the component in at least one zone to be treated located in the depth, that is to say at a distance from a surface of this component, without impairing or affecting the properties of the component in the space separating this surface from the zone to be treated and further in the depth, beyond this zone to be treated.

Another objective of the present invention is to provide a treatment process that in particular imposes no constraints either on the nature or on the structure of the constituent material or materials of the component to be treated.

Another objective of the present invention is to provide a treatment process whose operating cost is in particular relatively low.

Another objective of the present invention is to provide a treatment process allowing, in particular, savings to be made as regards to the constituent material or materials of the component to be treated.

Another objective of the present invention is to provide a treatment process that can be applied especially in the field of membranes and thin films, especially semiconductor thin films, in the field of the production of wafers or plates of material, in the field of the production of semiconductor wafers or slices, especially those made of silicon, of semiconductors of the IV type, IV-IV type, III-V type and II-VI type, in order to obtain electronic or optoelectronic components, such as photovoltaic cells or elements, and in the field of the welding or brazing of parts of a workpiece.

The subject of the present invention is a process for the treatment of a component, at least one zone to be treated of which located in the depth of this component at a certain distance from the surface thereof, has at least one property that can be modified when this zone is subjected to a thermal energy density above a specified treatment level.

According to the invention, this process consists in placing the component to be treated at a thermal energy level below said specified level; and in subjecting, through its aforementioned surface, for a specified time and in the form of at least one pulse, said component to a power flux generated by a particle emission means, this emission means being regulated so as to produce a thermal energy density that is concentrated on or has a localized maximum in said zone to be treated and reaching, in at least part of this zone, a level above said specified treatment level.

The process according to the invention preferably consists in choosing a power flux exclusively adapted for producing said thermal energy density.

According to the invention, said specified thermal energy level may advantageously correspond to a specified temperature.

According to the invention, said component may advantageously be made of a single material or of several parts of different materials.

According to the invention, said component may advantageously have a surface structure and/or a volume structure.

According to the invention, said power flux preferably consists of a flux of particles such as electrons and/or protons and/or ions and/or atoms and/or molecules.

According to the invention, said power flux may advantageously be formed by a flux of particles consisting or composed of elements of atomic number Z less than or equal to six, which are not dopants for the constituent material or materials of said component, in any one of their isotopic species, in any one of their molecular forms and in any ionization state, including the neutral state.

According to the invention, said particles may advantageously be essentially monokinetic.

According to the invention, the process may advantageously consist in choosing a component whose zone to be treated includes impurities.

According to the invention, said impurities preferably have a segregation coefficient, relative to the constituent material of at least said part to be treated, of less-than one.

According to the invention, the process may advantageously include a prior step of introducing said impurities into the material.

According to the invention, said step of introducing said impurities preferably includes at least one epitaxial growth.

According to the invention, said impurities may advantageously be introduced at least partly during application of said power flux.

According to the invention, the constituent material of at least said zone to be treated may advantageously comprise silicon and at least-said zone to be treated contains impurities chosen from aluminium and/or bismuth and/or gallium and/or indium and/or antimony and/or tin.

According to the invention, the constituent material of at least said zone to be treated may advantageously comprise silicon-germanium.

According to the invention, the process may advantageously consist in subjecting said component to a flux whose power is constant over time.

According to the invention, the process may advantageously consist in varying the intensity of the power flux.

According to the invention, the process may advantageously consist in varying the position of the concentrated part of said power flux relative to said zone to be treated.

According to a variant of the invention, said power flux is preferably chosen so as to liquefy the constituent material of said zone to be treated.

According to another variant of the invention, said power flux is preferably chosen so as to produce inclusions in the constituent material of said zone to be treated.

According to the invention, said inclusions may advantageously be precipitates and/or bubbles and/or microbubbles and/or defects and/or changes of phase and/or of chemical composition and/or fractures and/or cavities.

According to another variant of the invention, said power flux is preferably chosen so as to weaken said zone to be treated.

According to another variant of the invention, said power flux is preferably chosen so as to weld or braze together two parts of said component that are in contact in said zone to be treated.

The present invention will be better understood thanks to the following non-limiting explanations as regards the component to be treated.

The component to be treated may be of a bulk form or be in the form of one or more thin layers, and be either homogeneous or heterogeneous in form and/or have a surface structure and/or a volume structure. One particular example is a block of single-crystal silicon cut longitudinally from a cylindrical ingot. Another example is a silicon wafer on which a silicon-germanium or silicon-germanium-carbon layer 500 angstroms in thickness is grown, on which a five micron silicon layer is grown.

The component may consist of at least two parts, made of one material or of different materials, in simple contact at a common surface that consequently constitutes an interface within this material. The power flux used in the invention may be applied through one of the surfaces of the material-so as to create a zone of high thermal energy at this interface, for example to produce welding or brazing.

The material may also include impurities, defined as atoms or molecules or particles, that are in a stable or metastable state, i.e. unable to change discernibly, under, standard temperature conditions. In one particular, method implementation, the purpose of the treatment of the material having these impurities is to generate inclusions. The inclusions may be particle agglomerates, bubbles, both of substantially spherical shape and of flattened shape, resulting for example from the vaporization of the material or from the impurities passing into a gas phase, precipitates of atoms or molecules, precipitates of defects, cavities structural defects, fractures, new chemical compounds, new phases, or any combination of these elements. The impurities may be everywhere in the material, but must be at least partly in or near the treatment zone.

One step of introducing said impurities into the material may be provided prior to and/or during the treatment. For example, if the desired impurity contains hydrogen, it may possibly be partly introduced during application of the power flux if the latter consists of a flux of hydrogen based particles. This introduction step may be carried out during fabrication of the material or subsequently. In particular, in situ doping, diffusion, ion implantation, film deposition and epitaxial growth techniques may be used.

The present invention will also be better understood thanks to the following non-limiting explanations as regards the power flux employed.

When a flux of power P is directed for a time $\Delta t$ onto a material capable of absorbing this power, the material absorbs an amount of energy $E_a$ equal to $P\Delta t$. If the intensity of the power flux is not constant over the time $\Delta t$, the energy $E_a$ absorbed may be calculated by dividing the time $\Delta t$ into time intervals $\delta t$ in which the power flux may be considered as being constant and adding the contributions corresponding to each time interval $\delta t$. The absorbed energy $E_a$ density profile, i.e. the curve representing the amount of energy absorbed per unit volume as a function of the depth d, depends on the power flux parameters, i.e. the experimental conditions and, in particular, the nature of the power flux and of its characteristics, and also of the material itself.

If the power flux parameters vary over the course of time, the shape of the absorbed energy density profile varies over time. At a given instant, the absorbed energy density profile is obtained by taking into account the contributions relating to each of the intervals $\delta t$.

In the case of a flux of particles, the kinetic energy of each particle or particle energy e is determined by its mass and its velocity, and this kinetic energy e is generally measured in electron volts or a multiple of this unit. In the case of monokinetic particles that are completely absorbed in the material, the energy $E_a$ is equal to Ne and the power P is equal to $Ne/\Delta t = E_a/\Delta t$, where N is the number of particles that have been directed into the material during the time interval $\Delta t$. It is therefore obvious that the power is very strongly dependent on the time $\Delta t$, for the same value of absorbed energy $E_a$ During penetration of the particles into the material, the kinetic energy of these particles is extremely rapidly transformed in the material, through various physical mechanisms, such as electron excitation (transfer of energy to electrons), phonon creation, or ionization or displacement of atoms, or the breaking of chemical bonds, into essentially thermal energy, i.e. into heat. The increase in the thermal energy density is generally manifested by an increase in the temperature and/or a supply of energy for activating physical and/or chemical reactions such as, for example, phase changes or chemical-reactions.

The effect of the power flux is therefore to create one or more thermal energy sources. The heat or thermal energy in a material changes according to the known laws in physics, called the heat equations, that take into account the thermal parameters of the material, the thermal conditions at the interfaces and at then surfaces, the initial conditions and the thermal energy sources that represent, at each point in the material, the amplitude of the thermal energy density supplied to the material as a function of time.

For example, the basic equations governing the physics of heat in solids will be found in the reference document "*Conduction Of Heat In Solids*", second edition, by H. S. Carslaw and J. C. Jaeger, Oxford University Press, Walton Street, Oxford OX2 6DP. By solving these equations, it is possible to determine the thermal energy density profile in the material as a function of time, that is to say the temperature and the state of the various phases. To solve these equations in the general case must be carried out on a computer using numerical methods known per se, for example using the finite-difference methods or the finite-element method.

Generally speaking, the thermal energy density profile resulting from a pulsed power flux directed onto the material is not in the steady state, i.e. it changes with time, during and after the time $\Delta t$, and its natural tendency is to broaden.

For a given amount of thermal energy, the broadening that takes place is to the detriment of the thermal energy density level. Now, to treat a material in a specified zone it is necessary for the thermal energy in the treatment zone to reach a sufficient level capable of activating the desired process. It is therefore absolutely essential for the thermal energy resulting from the power flux to be concentrated in the treatment zone.

To achieve this, the solutions is, on the one hand, for the energy to be absorbed in a depthwise concentrated manner in and/or near the treatment zone and, on the other hand, for the duration of the power flux to be sufficiently short and the intensity of the power flux to be high enough for the thermal energy profile to remain sufficiently concentrated and for its level to be sufficient for the treatment of the material in question.

More precisely, according to the invention, it is preferred to use a flux of light particles chosen, possibly in combination, from electrons or ions or atoms or molecules consisting or composed of elements of low atomic number Z, in any one of their isotopic species, in any one of their molecular forms and in any ionization state, including the neutral state. The expression "elements of low atomic number Z" is understood to mean those in which Z, i.e. the number of protons in the nucleus, is less than or equal to 6. In particular, Z will be chosen to be less than 3 and preferably equal to 1, corresponding to hydrogen. This is because, for said light particles, it is possible to find conditions such that, during their penetration into a material, these particles transfer energy to the material in the form of a profile concentrated at a certain depth. These conditions correspond to particles with a particle energy that is higher the higher their Z. For example, it is possible to obtain a deposited energy profile having a peak at a depth of approximately 20 microns with 1.2 MeV protons or 5 MeV helium ions or 10 MeV lithium ions or 25 MeV carbon ions. For a given maximum depth, these profiles are generally narrower the lower the atomic number Z of the particle.

To avoid any problem of undesirable doping when the material is a semiconductor, these particles are chosen from those that are not dopants for said material. For example, in the case in which the material is silicon, if it is desired not to create p-doping, then boron is excluded.

Figure 2A:
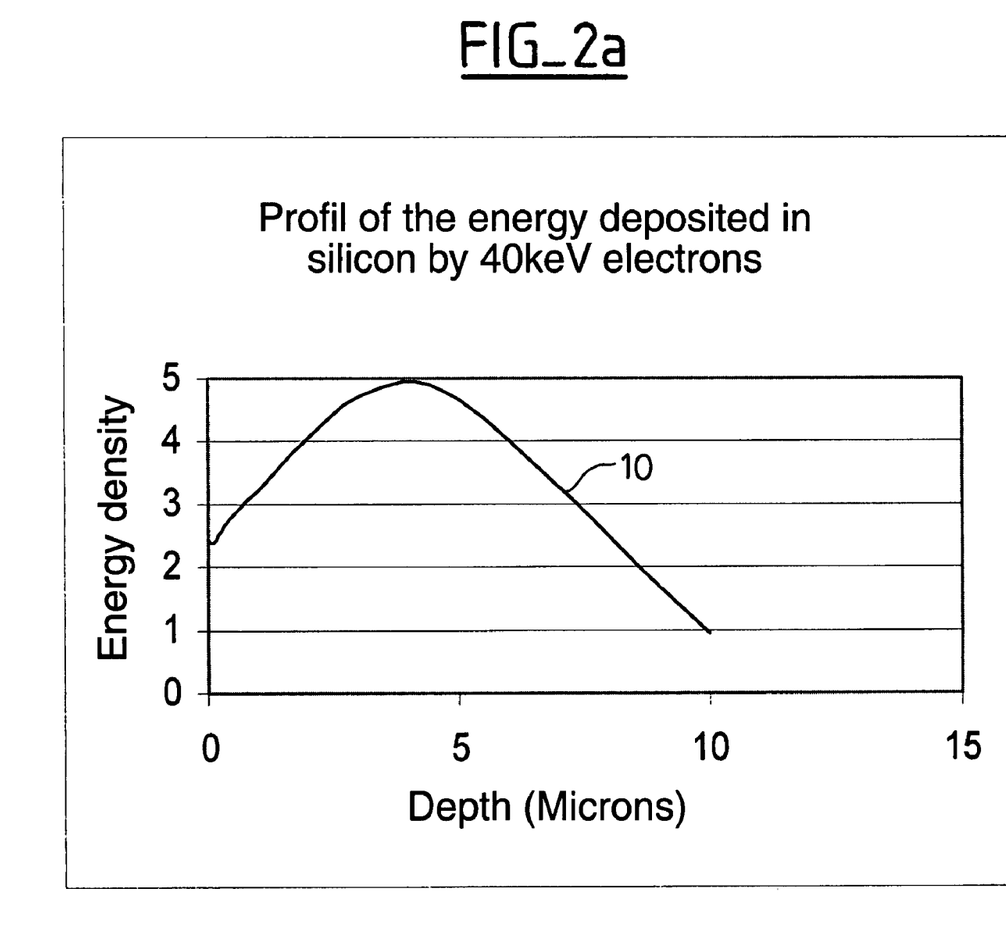
FIGS. 2a and 2b show energy density.

In the case of electrons, it is possible to calculate, using suitable software, the distribution of the energy density as a function of the depth in a material subjected to a flux of monoenergetic electrons. This distribution may also be found directly in databases such as EMID (Electron Material Interaction Database) published by IDEA (Institute for Data Evaluation) and the Radiation Dynamics Group (RDG) of Kharkov National University of Ukraine. A profile having a bell-shaped curve is obtained, having a maximum at a depth that depends on the energy of the electrons. FIG. 2a gives the energy deposition profile for 40 keV electrons in silicon. This calculation is carried out under the assumption that the dimensions of the electron flux over the surface are substantially larger than the lateral dispersion of the electron path in the material. In the above example, this assumption is justified whenever the dimensions of the electron flux over the surface of the material are appreciably greater than 10 microns. Otherwise, the shape of the curve depends on the dimensions of the flux; however, the same type of calculation may be carried out and does give a curve of similar shape.

The table below gives the calculated approximate values of the depth of the maximum in the energy deposition profile in the case of silicon.

| Energy (in keV) | 5 | 10 | 20 | 40 | 60 | 100 |
|---|---|---|---|---|---|---|
| Depth (in microns) | 0.11 | 0.33 | 1.2 | 4 | 8 | 20 |

The process may be carried out using protons, that is to say hydrogen ions. Other types of light particles may be used, although implementation of the method is more favorable when a narrow energy deposition profile with particles of the lowest possible Z is desired.

The penetration of ions into a material is accompanied essentially by two braking mechanisms, namely "electronic braking" and "nuclear braking". To simplify matters, nuclear braking contributes essentially to transferring energy to the atoms of the material and electron braking contributes essentially to transferring energy to the electrons of the material. Using simulation software, such as TRIM or SRIM, it is possible to calculate the distribution of the absorbed energy density as a function of the depth in a material subjected to a flux of monoenergetic particles. A bell-shape profile having a maximum of a depth that depends on the energy of the particles is obtained. It is important to note that this absorbed energy deposition profile is in general different from that of the concentration profile of the species, which represents the density of the implanted species as a function of the depth, and is also different from the density profile of the defects created.

It may be observed that the more monokinetic the particle flux, the narrower the energy deposition peak and the more concentrated the energy. If it is desired for the energy deposition to have a broader peak, or even several peaks, it is possible to use particles of different energies, or even different particles.

To obtain a zone of high thermal energy density in the treatment zone, it is therefore necessary:

to choose particle flux parameters such that most of this power is deposited in/or near the treatment zone;

to choose a time $\Delta t$, during which the power flux is directed onto the material, that is short enough for the thermal energy resulting from the primary energy to be able to build up in and near the treatment zone before it diffuses away from this zone; and to choose the intensity of the particle flux so that, during the time $\Delta t$, the energy supplied by the particles is sufficient for said thermal energy density level to be reached in the treatment zone.

The time $\Delta t$ may be calculated by simulation using known suitable software, generally using finite-difference methods or finite-element methods.

Another way of determining this time is a method that is simpler to implement. It consists firstly in roughly determining the value of the maximum time and then in adjusting it by means of several experiments. For a rough determination, we consider the root mean square deviation $\sigma_p$ of the energy deposition profile resulting from the interaction of the particle flux with the material and the root mean square deviation $\sigma_t$ of the desired thermal energy profile ($\sigma_t$ is necessarily at least equal to $\sigma_p$).

Next, the time $\Delta t$ is estimated from the following inequality:

$$2L_t^2 = 2D\Delta t < \sigma_t^2 - \sigma_p^2$$

in which $L_t$ is the thermal diffusion length and D is the thermal diffusivity at the temperature in question. This calculation gives a better approximation the more $\sigma_t$ exceeds $\sigma_p$.

For example, in silicon in which the thermal diffusivity at high temperature is of the order of 0.1 cm²/s for a desired thermal energy profile with a root square deviation $\sigma_t$ of 3 microns and an absorbed energy profile with a root square deviation $\sigma_p$ of the order of 1 micron, this corresponds to a maximum time $\Delta t$ of around 0.4 microseconds.

When $\Delta t$ is known, it is then possible for the shape of the thermal energy density profile in the material to be determined precisely and, since the level to be reached in the treatment zone is known, it is possible by numerical integration to deduce therefrom the total amount of thermal energy and therefore to determine the necessary power intensity level over the time $\Delta t$.

The flux must therefore be in the form of a pulse of a high power and short duration so that the required thermal energy level is reached in the layer to be treated. If the treatment of the material requires a longer time than that permitted by a single pulse, it is possible to apply several pulses so that the cumulative time is suited to the treatment.

Additionally, but not necessarily, it may be advantageous for certain types of process not only to control the duration of the high thermal energy level but also to control the rise and/or fall of the thermal energy level. To do this, it is possible to modulate the amplitude of the pulse as a function of time.

To produce a power flux in the form of a pulse, several methods of implementation are possible:
  use of a power flux that is spatially constant with respect to the material to be treated, the intensity of which as a function of time is in the form of one or more pulses;
  use of a power flux whose intensity as a function of time is constant, but the position of which varies with respect to the material so that a given region of the material sees the flux only for one or more time intervals corresponding to the duration of the desired pulse (or of the desired pulses); and
  a combination of the two above methods of implementation.

To produce a power flux whose position varies with respect to the material, that is to say with respect to the treatment zone and approximately perpendicular to the latter, it is possible, for example, to produce the particle flux in the form of concentrated beams (using, for example, a quadropole lens focussing system) and by means of a system using time-dependent electromagnetic forces (for example by means of coils) and to move the beam relative to the material (scanning), i.e. relative to the treatment zone and perpendicular to the latter. In the reference article "*Focused MeV Ion Beams for Materials Analysis and Microfabrication*", MRS BULLETIN, February 2000, Volume 25, No. 2 (a publication of the Materials Research Society), page 33 to 37, an example of equipment for producing focused scanned proton beams is given on page 34 in FIG. 2. Although the application described in that example does not relate to the present invention, the principles used to generate the proton beam and to move it relative to the material may be used for our invention.

However, it should be noted that, that to produce beams for obtaining the desired current density, it is necessary for the energy of the protons to exhibit little dispersion. Otherwise, chromatic aberrations (owing to the dispersions in the energy of the protons and therefore dispersion in their velocity) would broaden the focal spot. It is therefore recommended to make use of an ion accelerator capable of low energy dispersion. Conventional electrostatic accelerators of the Van De Graaff type, with electrical charge transport by belts or chains, are very limited in this field. An electrostatic accelerator of the singletron type sold by HVEE (High Voltage Engineering Europa BV) better meets the requirements as it allows energy dispersions within the $10^{-5}$ range. Further details will be found in the following reference article: "*The novel ultrastable HVEE 3.5 MeV singletron accelerator for nanoprobe applications*", D. J. W. Mous, R. G. Haitsma, T. Butz, R.-H. Flagmeyer, D. Lehmann and J. Vogt in Nuclear Instruments and Methods in Physics Research B 130, 31-36, (1997).

Figure 4:
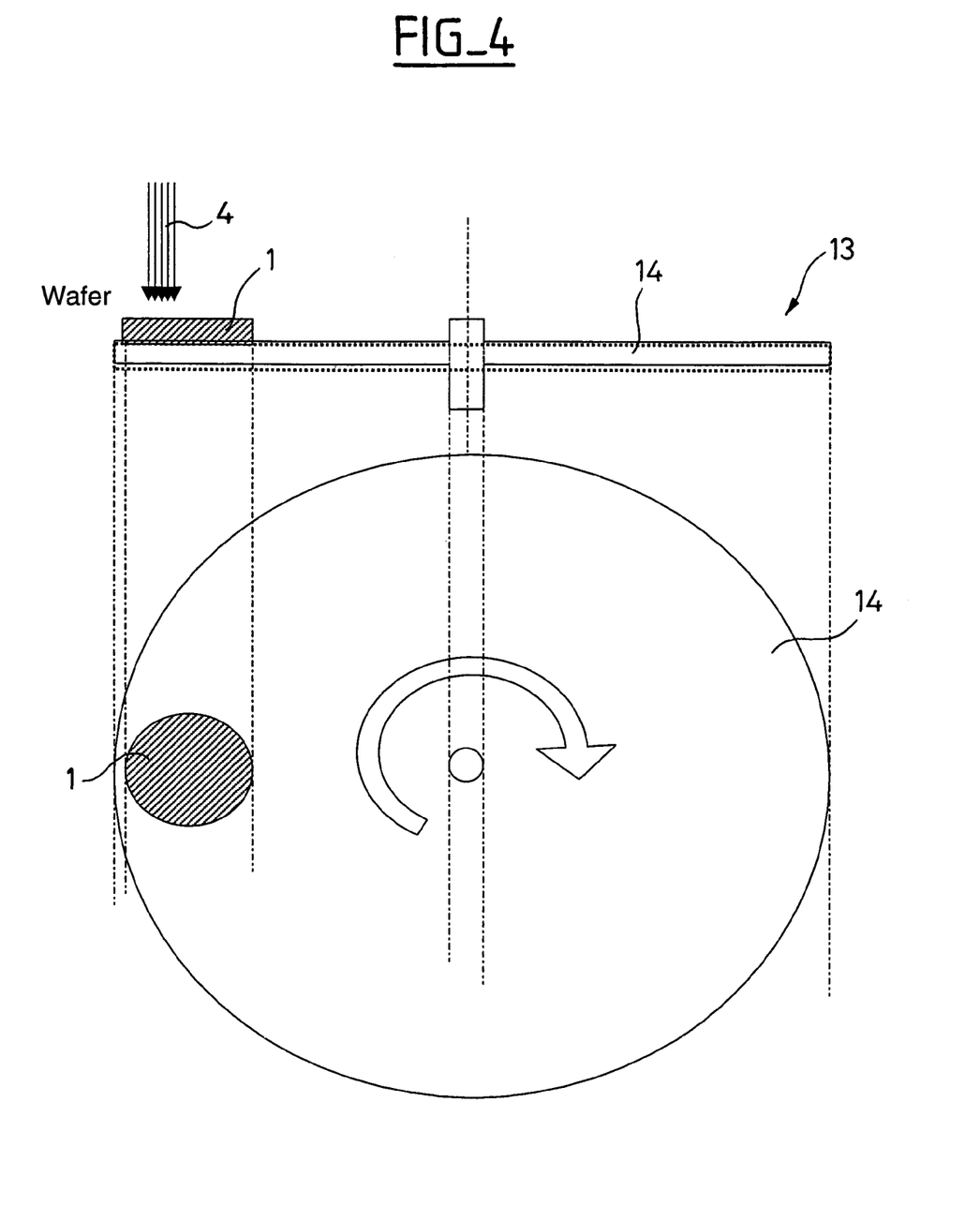
FIG. 4 shows in a side view and above the treatment apparatus

It is also possible to leave the beam fixed in space and to move the component relative to the beam, for example by fastening this component to a wheel that rotates at high speed. In one non-limiting embodiment, a 1 MeV proton beam is formed with a diameter of about 100 microns and a current of about 2.6 mA. This beam is directed onto silicon wafers fastened to the peripheral part of the surface of a disk about 2 m in diameter rotating at a speed of about 3 200 rpm (FIG. 4). Under these conditions, upon passing beneath the beam any point on the wafer receives a power flux pulse of about 0.3 microseconds duration. This pulse is suitable for the thermal energy density reached between a depth of 12 microns and a depth of 17 microns to be around 7000 J/cm³. The rotation movement of the disk may be combined with a displacement movement of the spindle of the disk parallel to itself so that the treatment with the proton flux can be applied, for example, at each point on the wafers.

To produce a power flux whose intensity as a function of time is in the form of one or more pulses, it is possible to use, for example in the case of protons, a machine operating according to the principles of certain machines used for heating plasmas by the injection of an intense pulsed beam of particles. In general, these machines comprise means for producing a very dense plasma, means for extracting and accelerating the ions in a very high electric field and, optionally, means for preventing any breakdown (arc formation) in the extracting and accelerating gaps, for example by the use of judicially positioned magnetic fields (magnetic isolation of the accelerating gaps). An example of such equipment is described in the John B. Greenly patent US-RE-37,100. In the case of electrons, it is possible to use a machine of the type described in the reference article "*Principles of high current electron beam acceleration*", Stanley Humphries Jr., Nuclear Instruments and Methods in Physics Research A258(1987) 548-565.

Alternatively, the electron beam may be generated by means of an electron gun having a cold emission cathode of the microtip type with the associated electrode or electrodes, similar to those used in flat screens (field emission displays) based on microtips.

The following non-limiting example shows how to realize the principles of the invention. The material is a single-crystal silicon wafer 200 mm in diameter and about 750 microns in thickness. The surface may or may not be covered with thin films. This material contains antimony atoms with a concentration, for example, of around $10^{16}$ cm$^{-3}$ to $2 \times 10^{19}$ cm$^{-3}$. With a power flux transported by a 1 MeV proton beam, the surface is irradiated with a current density of 50 A.cm$^{-2}$ for a time of 0.2 microseconds.

An energy of around 10 J.cm$^{-2}$ is thus deposited. A zone between a depth of about 12 microns and a depth of about 17 microns is thus created in which the thermal energy density level reached is greater than or equal to about 7000 J.cm$^{-3}$. These values are given as a starting point. A fine adjustment may be made in order to take into account the change with time of the power flux pulse and the thermal conditions of the material, in particular at its surface.

This thermal energy density level is sufficient to activate the desired material treatment described below.

The thermal energy density level reached makes it possible to liquefy the material in a treatment zone lying between a depth of about 12 microns and a depth of about 17 microns, the extension of which-zone, in a plane parallel to the surface through which the power flux is introduced, is defined by the lateral dimensions of this flux, thus defining a liquid zone bounded by a solid/liquid interface above the approximately 12 micron depth and a solid/liquid interface below the 17 micron depth.

Most of the antimony atoms pre-existing in the solid phase in this zone, or near it, are in the liquid phase. Upon resolidification that occurs during cooling, the two solid/liquid interfaces each advance at their own rate toward each other (FIG. 6), thus reducing the width of the liquid zone.

Because of the low value of the segregation coefficient (sometimes called the distribution coefficient) of antimony in silicon, that is to say because of the tendency of antimony atoms to remain in the liquid phase rather than passing into the solid phase, the advance of the two solid/liquid interfaces has the effect of pushing the antimony atoms in front of them into the liquid phase, thus resulting in an ever greater concentration of antimony atoms in the liquid phase.

When the liquid phase has disappeared, all the antimony atoms are necessarily in the material in the solid state. This results locally in a very high concentration of impurities in a narrow zone near the depth referred to as the meeting depth, at which the two solid/liquid interfaces meet and therefore at which the liquid phase completely disappears.

Under judicially chosen experimental conditions, it is possible then to be in a situation in which the antimony atoms are at a concentration such that these atoms can no longer be normally incorporated into the solid phase, thus giving rise to precipitates., structural defects, formation of heterogeneous mixtures, etc. It is thus possible to weaken the material through this mechanism and achieve a separation between that part of the material lying between the surface and the weakened zone and the rest of the material.

It should be noted that, after the treatment, the sub-surface part of the material, lying between the surface and the high thermal energy zone, remains in the solid and crystalline state in accordance with the basic principles of the invention and that the part of the material lying between the subsurface zone and the vicinity of the meeting front may retain its crystalline properties, since the material may undergo epitaxial regrowth during the resolidification phase from the solid crystalline material of the subsurface zone.

The resolidification phenomenon may be more complex than that described above since the advance of the two —upper and lower —interfaces may be combined with an advance of the lateral interfaces, and even with the formation of discontinuous liquid zones separated by resolidified zones. However, whatever the complexity of the mechanisms involved, this always results in the impurities being concentrated in a very small volume of material.

In this example, the antimony atoms may have been introduced during growth of the ingot from which the wafer was obtained, giving an approximately homogeneous concentration throughout the volume. The antimony atoms may, in another method of implementation, be, for example, in a subsurface layer some 20 microns in thickness. In the latter case, this high antimony concentration may be obtained: by growing an antimony-doped layer 20 microns in thickness by epitaxy on a scarcely doped or undoped silicon substrate.

It is also possible in a different manner to use a highly antimony-doped silicon wafer on which a single-crystal layer of scarcely or lightly doped silicon is grown by epitaxy, if it is desired to preserve a lightly doped layer on the surface in order to fabricate devices. The thickness of this scarcely doped layer in the particular case indicated above (1 MeV protons) may have a thickness of up to around twelve microns.

While keeping a lightly doped surface layer, it is also possible to have localized antimony doping within a deep layer. This is obtained for example by producing, on the surface of a wafer, an antimony-doped layer (for example, by $10^{15}$ $cm^{-2}$ ion implantation at 150 keV followed by a diffusion heat treatment of 6 hours at 1150° C.), followed by epitaxial growth of scarcely doped or undoped silicon with a thickness of around twelve microns.

In the above example, antimony atoms were used. The principle also operates with other atoms having a low segregation coefficient relative to silicon, such as for example, but implying no limitation, aluminum, bismuth, gallium, indium and tin.

The choice of other impurities or atoms is possible. This choice depends on the constraints of the intended application. For example, an atom such as antimony will be chosen if it is desired for the residual doping of the treated zone to be of the n type, while an atom such as aluminum will be chosen if it is desired for the residual doping of the treated zone to be of the p type.

In all these examples, in which epitaxial growth is used, the epitaxial process may either be a process of the CVD type or a process of the liquid phase epitaxy type; in particular, a liquid phase epitaxy of silicon from a bath of molten tin or aluminum or indium in which silicon has been dissolved, may be one of the preferred ways of producing photovoltaic cells.

Figure 1:
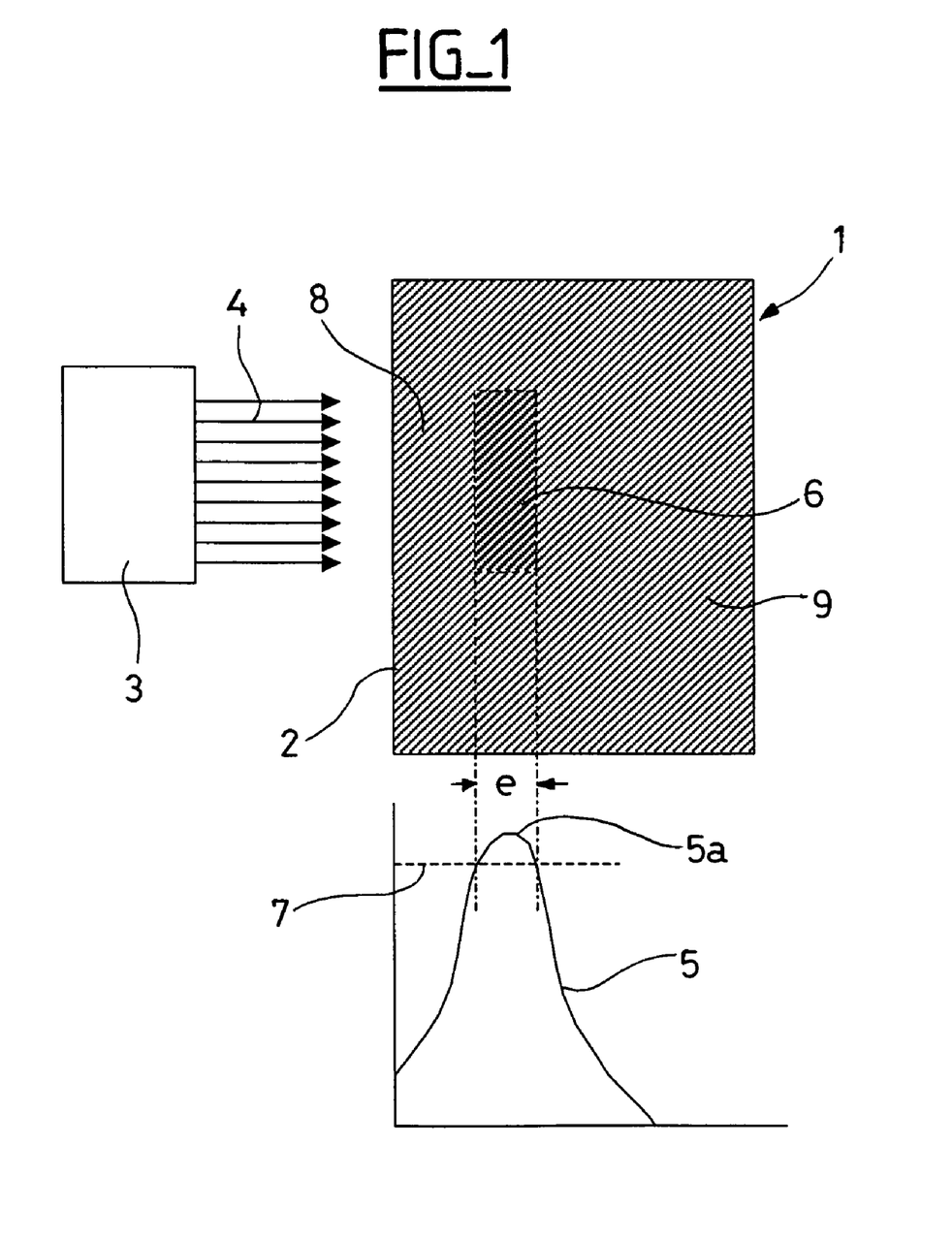
FIG. 1 shows a cross section of the apparatus.

To illustrate, generally and schematically, the present invention and in particular the above examples and explanations, reference may be made to the appended FIG. 1 which shows, in cross section, a component 1 of parallelepipedal shape, that has a front flat surface 2 at a certain distance away from which an apparatus 3 for emitting a particle flux 4 is installed.

This power flux 4 is introduced into the component 1 perpendicular to its surface 2 and produces, in the component 1, a thermal energy density whose profile or curve 5 at the end of the power flux pulse has been shown. The profile 5 is, parallel to the surface 2, approximately in the form of a bell or a peak, and the maximum of this profile 5 lies in a treatment zone 6 localized in the depth at a certain distance from the surface 2 of the component 1. Of course, the power flux 4 could be introduced into the component 1 at another angle of incidence than that corresponding to normal incidence.

With a component 1 placed at a thermal energy level below the specified treatment level 7, in particular at a temperature below a specified treatment value, the thermal energy density 5 produced by the power flux 4 exhibits a peak 5a that reaches the specified treatment level 7 and exceeds-this level over a thickness d such that at least one property of the constituent material of the zone 6 to be treated is modified in this thickness d and over the surface corresponding approximately to the cross section of the power flux 4. It follows that the properties of the rest of the component 1, and in particular its part 8 lying between the surface 2 and the zone 6 and its part 9 lying beyond this zone 6 are not impaired or modified.

Figure 2B:
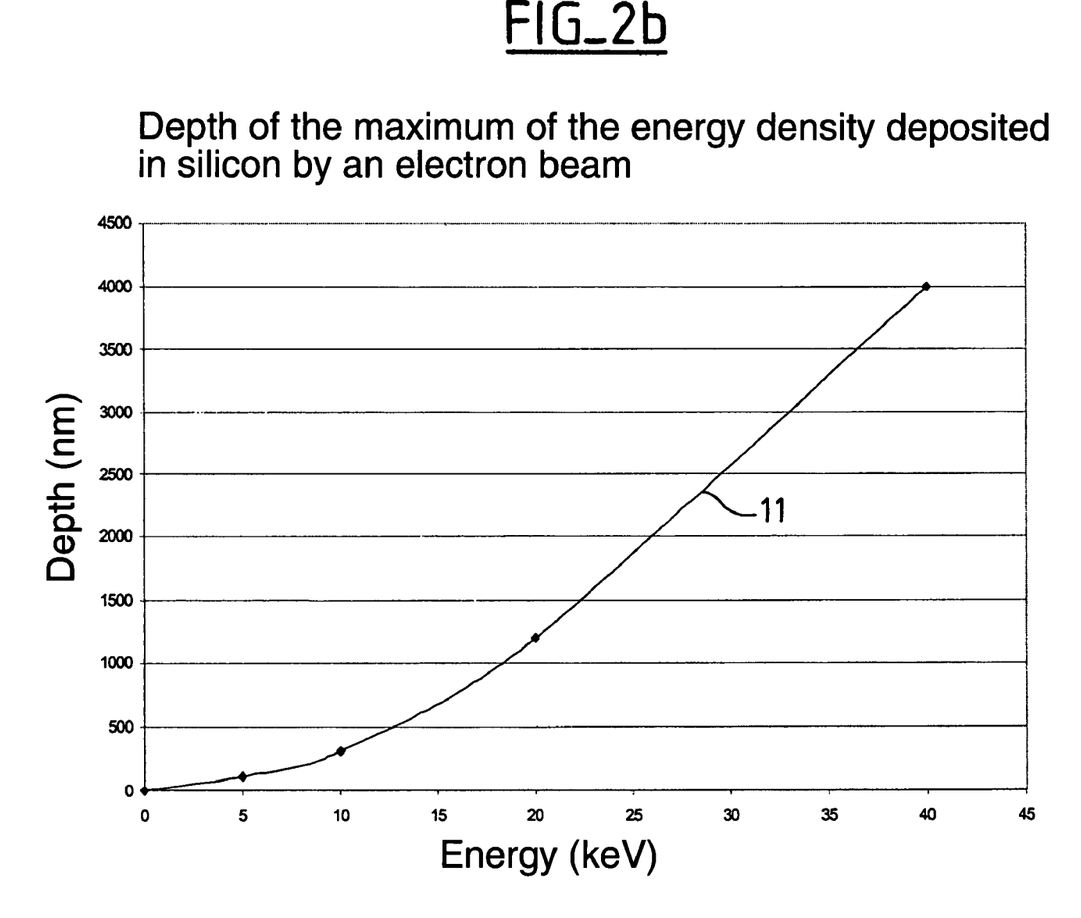

FIG. 2a shows a curve 10 that represents the approximately bell-shaped profile of the energy density deposited as a function of the depth, produced in a silicon wafer by an electron flux and FIG. 2b shows a curve 11 that represents approximately the depth of the maximum energy density deposited by an electron flux or electron beam in a silicon wafer.

Figure 3:
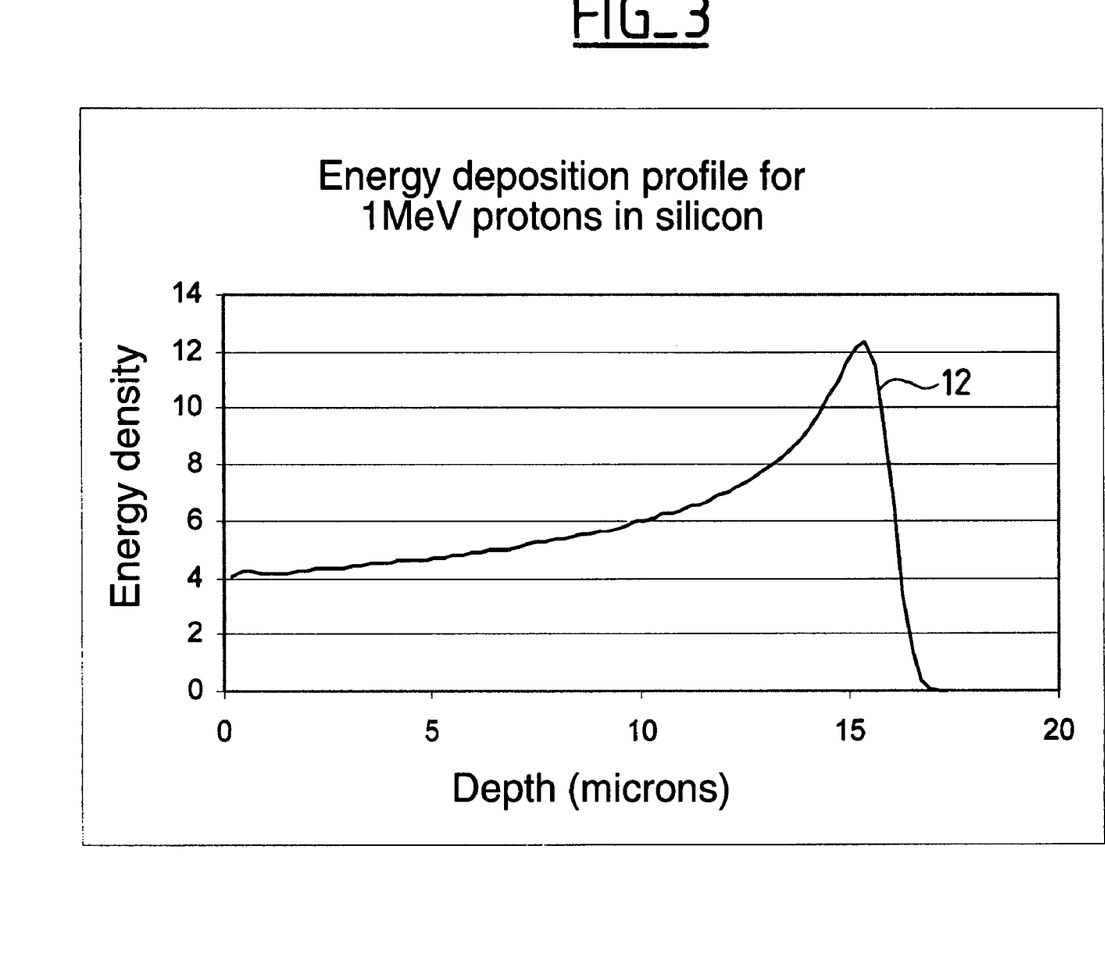
FIG. 3 shows the profile of deposited energy density.

FIG. 3 shows a curve 12 that represents the profile, with a pronounced peak, of the deposited energy density as a function of the depth, produced in a silicon wafer by a proton flux.

FIG. 4 shows, in side view and from above, a treatment apparatus 13 that comprises a rotating plate 14 on which a component 1 to be treated is placed between its center and its edge. The component 1 passes in front of a power flux 4 in such a way that this component 1 is subjected, at each revolution of the plate 14, to a pulse of the power flux 4. The number of revolutions that the plate 14 must perform depends on the treatments to be obtained that were described above.

Figure 5:
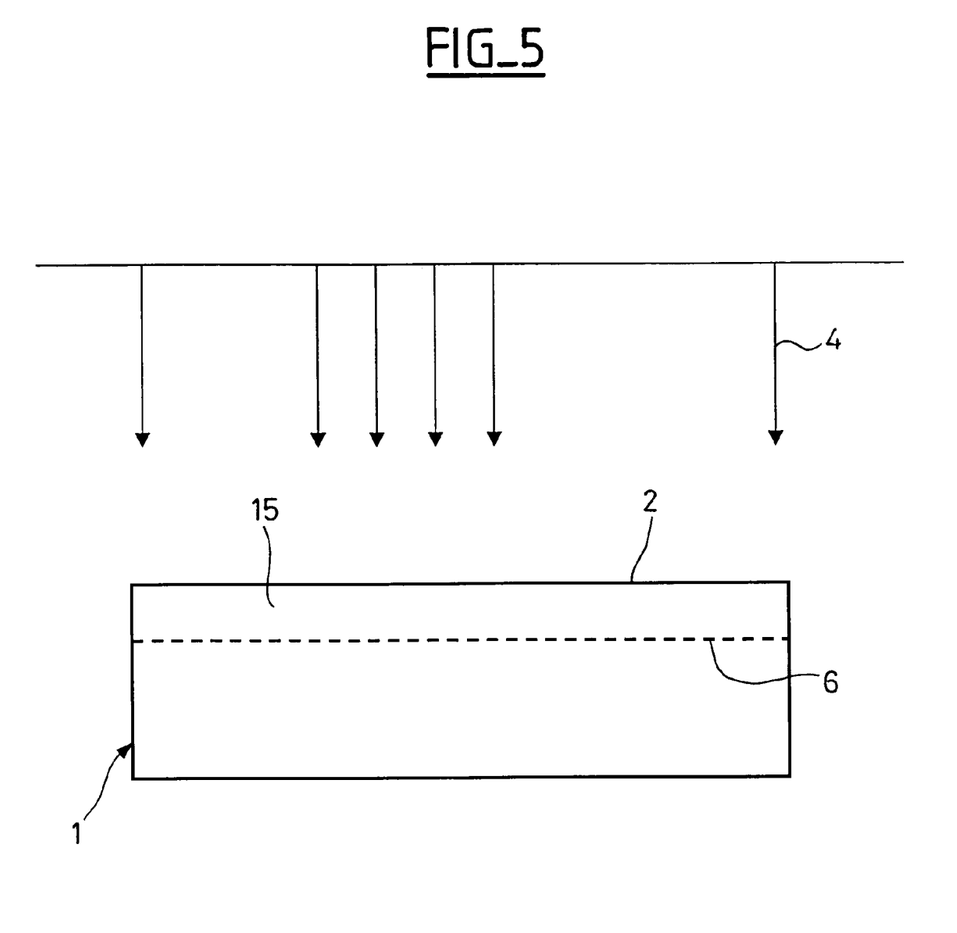
FIG. 5 shows a cross section a of wafer to be treated

FIG. 5 shows, in cross section, a component 1 to be treated, formed by a wafer from which it is desired to extract slices 15.

To do this, a particle flux 4 is applied that weakens the material in a zone 6 to be treated at a depth away-<from its surface 2, corresponding to the thickness of the desired slice, in such a way that this slice 15 is thus separable.

In an example, this arrangement is particularly advantageous from a technical standpoint and from a cost standpoint for producing thin silicon photovoltaic cells, in particular with a thickness of the order of 10 to 100 microns.

Figure 6:
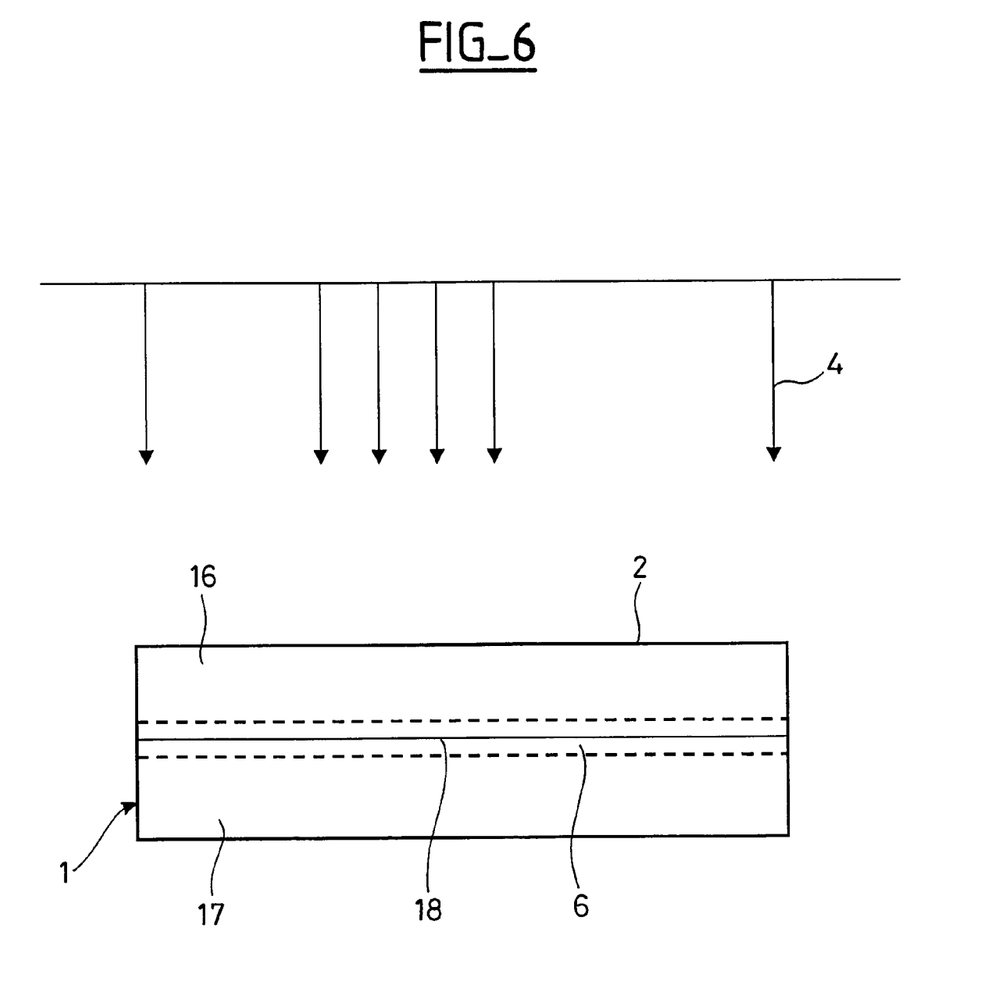
FIG. 6 shows a component to be treated.

FIG. 6 shows the component 1 to be treated, formed by two parts-16 and 17 that are in contact via an interface 18 and that it is desired to weld or braze.

To do this, a particle flux 4 is applied that causes a temperature rise and/or melting in a zone 6 to be treated that includes the interface 18, suitable for welding or brazing the two parts 16 and 17 to each other.

Figure 7:
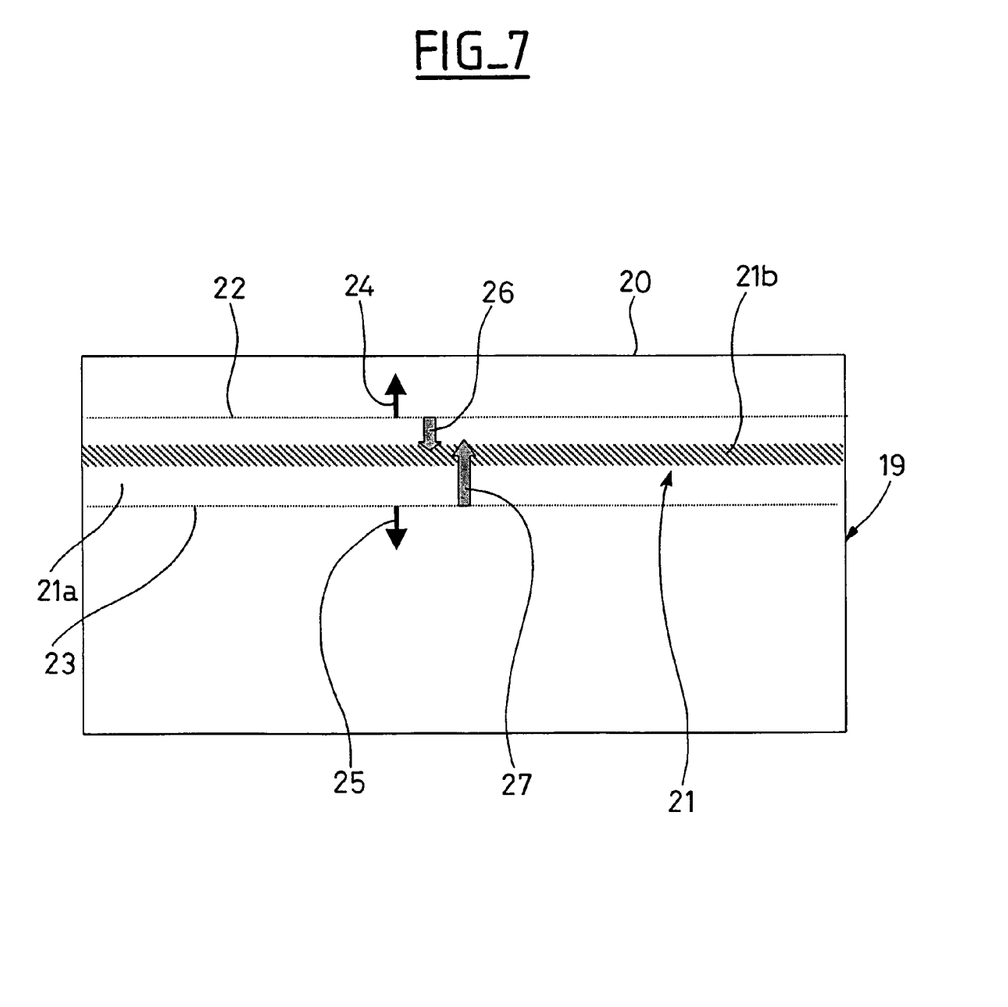
FIG. 7 shows a component to be treated which is silicon.

FIG. 7 shows, in cross section, a component 19, for example made of silicon containing impurities having a segregation coefficient of less than 1 relative to silicon, such as antimony, aluminum, bismuth, gallium, indium or tin.

As described with reference to FIG. 1, a pulsed proton flux 4 is applied, the flux being introduced into the component 19 through its surface 20, the deposited energy density-having a profile corresponding to that shown in FIG. 3.

By tailoring the conditions of application of the proton flux 4 for this purpose, liquefaction of the silicon occurs in a zone 21 to be treated lying in the depth and located within the region of the peak of the deposited energy profile.

The liquid silicon phase 21a contained approximately between two solid/liquid interfaces 22 and 23 approximately parallel to the surface 20 progressively increases in thickness during the application of the proton flux 4, as shown by the arrows 24 and 25 attached to the interfaces, before reaching the maximum.

Because of the thermal diffusion in the rest of the component 19, the liquefaction phase is followed by a silicon resolidification phase that results in a progressive reduction in the distance between the interfaces 22 and 23, as shown by the arrows 26 and 27 attached to these interfaces. This resolidification phase generally, and essentially, occurs after the pulse of the proton flux 4 has been applied.

During the aforementioned silicon liquefaction phase, the impurities pass into solution in the liquid phase 21a.

During the aforementioned silicon resolidification phase, the impurities have a tendency to remain in the liquid phase 21a in such a way that, at the end of the silicon resolidification phase, these impurities are concentrated in the part 21b of the zone 21 to be treated that resolidifies last, i.e. in a silicon volume whose thickness is much less than the afore-mentioned maximum thickness of the liquid phase 21a.

These impurities may therefore be in the part 21b with concentration levels much higher than that of the solubility limit in the solid phase, thus forming precipitates and/or crystal defects that weaken the silicon in the concentration zone. The weakened part 21b may then constitute a zone for separating or breaking the component 19 into two parts.

The present invention is not limited to the examples described above Many alternative versions are possible without departing from the scope of the appended claims.

The invention claimed is:

1. A process for the treatment of a component having at least one property that can be modified when subjected to thermal energy levels above a specified treatment level, comprising:
   placing a component (1) for treatment, the component having a surface (2) and a depth, and the component being at a thermal energy level below a specified treatment level (7);
   subjecting the placed component to a power flux (4) generated by a particle emission apparatus (3) located proximate to the surface (2) of the component; and
   regulating the particle emission apparatus to (i) produce, for a specified time, at least one pulse having a thermal energy profile that includes thermal energy levels above and below the specified treatment level (7) and a maximum (5a) thermal energy level above the specified treatment level, (ii) localize the thermal energy levels above the specified treatment level (7) in at least one zone (6)
   that is a distance from the surface (2) and in the depth, and (iii) localize the thermal energy levels below the specified treatment level (7) between the surface (2) and the at least one zone (6), wherein,
   the location of the at least one zone (6) is determined by the location in the depth of the thermal energy levels above the specified treatment level (7),
   at least one property of the component is modified in the at least one zone (6), and
   the component is not modified between the surface (2) and the at least one zone (6).

2. The process of claim 1, further comprising choosing a power flux exclusively adapted for producing the pulse with the thermal energy profile.

3. The process of claim 1, wherein the thermal energy level corresponds to a temperature.

4. The process of claim 1, wherein the component is made of a single constituent material or of several parts of different materials.

5. The process of claim 1, wherein the component has a surface structure and/or a volume structure.

6. The process of claim 1, wherein the power flux consists of a flux of particles selected from the group consisting of electrons, protons, ions, atoms, molecules and combinations thereof.

7. The process of claim 1, wherein,
   the power flux is formed by a flux of particles comprising elements of atomic number Z less than or equal to six, which are not dopants for a constituent material or materials of the component, and the elements are in a form selected from the group consisting of isotopes, molecular form, ions, and a neutral state.

8. The process of claim 1, wherein the particles are essentially monokinetic.

9. The process of claim 1, wherein the at least one zone comprises a constituent material and impurities.

10. The process of claim 9, wherein the impurities have a segregation coefficient, relative to the constituent material of the at least one zone, of less than one.

11. The process of claim 9, further comprising introducing the impurities into the constituent material prior to treating the component.

12. The process of claim 9, wherein the step of introducing the impurities includes at least one epitaxial growth.

13. The process of claim 9, wherein the impurities are introduced at least partly during subjecting the component to the power flux.

14. The process of claim 1, wherein the at least one zone comprises silicon as a constituent material and impurities selected from the group consisting of aluminium, bismuth, gallium, indium, antimony, tin, and combinations thereof.

15. The process of claim 1, wherein the at least one zone comprises silicon-germanium as a constituent material.

16. The process of claim 1, wherein the particle emission apparatus produces a power flux that is constant over time and moves the power flux with respect to the component so that a given region of the component is exposed to the flux only for one or more time intervals corresponding to the duration of the pulses.

17. The process of claim 1, wherein the power flux is spatially constant with respect to the component and the power flux has an intensity in the form of one or more pulses so as to vary the flux as a function of time.

18. The process of claim 1, further comprising regulating the particle emission apparatus to vary the location of the maximum thermal energy level of the pulse relative to the at least one zone.

19. The process of claim 1, wherein the power flux is chosen so as to produce a pulse having a thermal energy profile that includes thermal energy levels above the specified thermal energy level sufficient to liquefy a constituent material of the at least one zone.

20. The process of claim 1, wherein the power flux is chosen so as to produce a pulse having a thermal energy profile that includes thermal energy levels above the specified thermal energy level sufficient to generate inclusions in a constituent material of the at least one zone.

21. The process of claim 20, wherein said inclusions are selected from the group consisting of precipitates, bubbles, microbubbles, defects, changes of phase, of chemical composition, fractures, cavities and combinations thereof.

22. The process of claim 1, wherein the power flux is chosen so as to produce a pulse having a thermal energy profile that includes thermal energy levels above the specified thermal level sufficient to weaken the at least one zone.

23. The process of claim 1, wherein the power flux is chosen so as to produce a pulse having a thermal energy profile that includes thermal energy levels above the specified thermal level sufficient to weld or braze together two parts of the component that are in contact with one another in the at least one zone.

24. A process for the treatment of a component having at least one property that can be modified when subjected to thermal energy levels above a specified treatment level corresponding to a specified temperature level, consisting of:

placing a component (1) for treatment, the component having a surface (2) and a depth, and the component being at a temperature level below a specified temperature level (7);

subjecting the placed component to a power flux (4) generated by a particle emission apparatus (3) located proximate to the surface (2) of the component; and regulating the particle emission apparatus to (i) produce, for a specified time, at least one pulse having a thermal energy profile that includes temperature levels above and below the specified temperature level (7) and a maximum (5a) temperature level above the specified temperature level, (ii) localize the temperature levels above the specified treatment level (7) in at least one zone (6) that is a distance from the surface (2) and in the depth, and (iii) localize the temperature levels below the specified temperature level (7) between the surface (2) and the at least one zone (6), wherein, the location of the at least one zone (6) is determined by the location in the depth of the temperature levels above the specified temperature level (7), at least one property of the component is modified in the at least one zone (6), and the component is not modified between the surface (2) and the at least one zone (6).

25. The process of claim 24, wherein the power flux consists of a flux of particles selected from the group consisting of electrons, protons, ions, atoms, molecules and combinations thereof.

26. The process of claim 24, wherein the power flux is formed by a flux of particles consisting or composed of elements of atomic number Z less than or equal to six, which are not dopants for the constituent material or materials of said component, in any one of their isotopic species, in any one of their molecular forms and in any ionization state, including the neutral state.

27. A process for the treatment of a component having at least one property that can be modified when subjected to thermal energy levels above a specified treatment level, consisting of:

placing a component (1) for treatment, the component having a surface (2) and a depth, and the component being at a thermal energy level below the specified treatment level (7);

subjecting the placed component to a power flux (4) generated by a particle emission apparatus (3) located proximate to the surface (2) of the component; and regulating the particle emission apparatus to (i) produce, for a specified time, at least one pulse having a thermal energy profile that includes thermal energy levels above and below the specified treatment level (7) and a maximum (5a) thermal energy level above the specified treatment level, (ii) localize the thermal energy levels above the specified treatment level (7) in at least one zone (6) that is a distance from the surface (2) and in the depth, (iii) localize the thermal energy levels below the specified treatment level (7) between the surface (2) and the at least one zone (6), wherein, the power flux consists of a flux of particles selected from the group consisting of electrons, protons, ions, atoms, molecules and combinations thereof, the location of the at least one zone (6) is determined by the location in the depth of the thermal energy levels above the specified treatment level (7), a constituent material of the component is liquefied in the at least one zone (6), and the component is not liquefied between the surface (2) and the at least one zone (6).

28. The process of claim 27, wherein the particles are essentially monokinetic.

29. A process for the treatment of a component having at least one property that can be modified when this zone is subjected to thermal energy levels above a specified treatment level, consisting of:
  placing a component (1) for treatment, the component having a surface (2) and a depth, and the component being at a thermal energy level below a specified level (7);
  subjecting the placed component to a power flux (4) generated by a particle emission apparatus (3) located proximate to the surface (2) of the component; and
  regulating the particle emission apparatus to (i) produce, for a specified time, at least one pulse having a thermal energy profile that includes thermal energy levels above and below the specified treatment level (7) and a maximum (5a) thermal energy level above the specified treatment level, (ii) localize the thermal energy levels above the specified treatment level (7) in at least one zone (6) that is a distance from the surface (2) and in the depth, (iii) localize the thermal energy levels below the specified treatment level (7) between the surface (2) and the at least one zone (6), wherein,
  the power flux is formed by a flux of particles comprising elements of atomic number Z less than or equal to six, which are not dopants for a constituent material or materials of the component,
  the elements are in a form selected from the group consisting of isotopes, molecular form, ions, and a neutral state,
  the location of the at least one zone (6) is determined by the location in the depth of the thermal energy levels above the specified treatment level (7),
  a constituent material of the component is liquefied in the at least one zone (6), and
  the component is not liquefied between the surface (2) and the at least one zone (6).

30. The process of claim 29, wherein the particles are essentially monokinetic.

31. A process for the treatment of a component having at least one property that can be modified when subjected to thermal energy levels above a specified treatment level, consisting of:
  placing a component (1) for treatment, the component having a surface (2) and a depth, and the component being at a thermal energy level below a specified treatment level (7);
  subjecting the placed component to a power flux (4) generated by a particle emission apparatus (3) located proximate to the surface (2) of the component; and
  regulating the particle emission apparatus to (i) produce, for a specified time, at least one pulse having a thermal energy profile that includes thermal energy levels above and below the specified treatment level (7) and a maximum (5a) thermal energy level above the specified treatment level, (ii) localize the thermal energy levels above the specified treatment level (7) in at least one zone (6) that is a distance from the surface (2) and in the depth, (iii) localize the thermal energy levels below the specified treatment level (7) between the surface (2) and the at least one zone (6), wherein,
  the component is chosen so as to include at least in the at least one zone (6) impurities having a segregation coefficient, relative to a constituent material of the component in the at least one zone (6), of less than one,
  the location of the at least one zone (6) is determined by the location in the depth of the thermal energy levels above the specified treatment level (7),
  the constituent material is liquefied in the at least one zone (6), and
  the component is not liquefied between the surface (2) and the at least one zone (6).

32. The process of claim 31, wherein,
  the constituent material of the at least one zone to be treated comprises silicon, and
  the at least one zone to be treated contains impurities from selected from the group consisting of aluminium, bismuth, gallium, indium, antimony, tin, and combinations thereof.

33. The process of claim 31, wherein the constituent material of the at least one zone to be treated comprises silicon germanium.

34. A process for the treatment of a component having at least one property that can be modified when subjected to thermal energy levels above a specified treatment level, consisting of:
  placing a component (1) for treatment, the component having a surface (2) and a depth, and the component being at a thermal energy level below a specified treatment level (7);
  subjecting the placed component to a power flux (4) generated by a particle emission apparatus (3) located proximate to the surface (2) of the component; and
  regulating the particle emission apparatus to (i) produce, for a specified time, at least one pulse having a thermal energy profile that includes thermal energy levels above and below the specified treatment level (7) and a maximum (5a) thermal energy level above the specified treatment level, (ii) localize the thermal energy levels above the specified treatment level (7) in at least one zone (6) that is a distance from the surface (2) and in the depth, (iii) localize the thermal energy levels below the specified treatment level (7) between the surface (2) and the at least one zone (6), wherein,
  the power flux is constant over time,
  the power flux position varies with respect to the component so that a given zone sees the flux only for one or more time intervals corresponding to the duration of the pulse,
  the location of the at least one zone (6) is determined by the location in the depth of the thermal energy levels above the specified treatment level (7),
  a constituent material of the component is liquefied in the at least one zone (6), and
  the component is not liquefied between the surface (2) and the at least one zone (6).

35. The process of claim 34, wherein the power flux consists of a flux of particles selected from the group consisting of electrons, protons, ions, atoms, molecules and combinations thereof.

36. The process of claim 34, wherein,
  the power flux is formed by a flux of particles comprising elements of atomic number Z less than or equal to six, which are not dopants for a constituent material or materials of the component, and
  the elements are in a form selected from the group consisting of isotopes, molecular form, ions, and a neutral state.

37. A process for the treatment of a component having at least one property that can be modified when subjected to thermal energy levels above a specified treatment level, consisting of:

placing a component (1) for treatment, the component having a surface (2) and a depth, and the component being at a thermal energy level below a specified treatment level (7);

subjecting the placed component to a power flux (4) generated by a particle emission apparatus (3) located proximate to the surface (2) of the component; and regulating the particle emission apparatus to (i) produce, for a specified time, at least one pulse having a thermal energy profile that includes thermal energy levels above and below the specified treatment level (7) and a maximum (5*a*) thermal energy level above the specified treatment level, (ii) localize the thermal energy levels above the specified treatment level (7) in at least one zone (6) that is a distance from the surface (2) and in the depth, (iii) localize the thermal energy levels below the specified treatment level (7) between the surface (2) and the at least one zone (6), wherein, the power flux is spatially constant with respect to the at least one zone (6), the power flux is in the form of one or more pulses so as to vary the as a function of time, the location of the at least one zone (6) is determined by the location in the depth of the thermal energy levels above the specified treatment level (7), a constituent material of the component is liquefied in the at least one zone (6), and the component is not liquefied between the surface (2) and the at least one zone (6).

38. The process of claim 37, wherein the power flux consists of a flux of particles selected from the group consisting of electrons, protons, ions, atoms, molecules and combinations thereof.

39. The process of claim 1, wherein, the power flux is formed by a flux of particles comprising elements of atomic number Z less than or equal to six, which are not dopants for a constituent material or materials of the component, and the elements are in a form selected from the group consisting of isotopes, molecular form, ions, and a neutral state.

40. A process for the treatment of a component, having at least one property that can be modified when subjected to thermal energy levels above a specified treatment level, consisting of:

placing a component (1) for treatment, the component having a surface (2) and a depth, and the component being at a thermal energy level below a specified treatment level (7);

subjecting the placed component to a power flux (4) generated by a particle emission apparatus (3) located proximate to the surface (2) of the component; and regulating the particle emission apparatus to (i) produce, for a specified time, at least one pulse having a thermal energy profile that includes thermal energy levels above and below the specified treatment level (7) and a maximum (5*a*) thermal energy level above the specified treatment level, (ii) localize the thermal energy levels above the specified treatment level (7) in at least one zone (6) that is a distance from the surface (2) and in the depth, (iii) localize the thermal energy levels below the specified treatment level (7) between the surface (2) and the at least one zone (6), wherein, the location of the at least one zone (6) is determined by the location in the depth of the thermal energy levels above the specified treatment level (7), inclusions are generated in a constituent material of the component in the at least one zone (6), and inclusions are not generated in a constituent material between the surface (2) and the at least one zone (6).

41. The process of claim 40, wherein the specified thermal energy level corresponds to a specified temperature.

42. The process of claim 40, wherein the at least one zone comprises silicon as a constituent material and impurities selected from the group consisting of aluminium, bismuth, gallium, indium, antimony, tin, and combinations thereof.

43. The process of claim 40, wherein the constituent material the at least one zone comprises silicon-germanium.

44. A process for the treatment of a component having at least one property that can be modified when subjected to thermal energy levels above a specified treatment level, consisting of:

placing a component (1) for treatment, the component having a surface (2) and a depth, and the component being at a thermal energy level below a specified treatment level (7);

subjecting the placed component to a power flux (4) generated by a particle emission apparatus (3) located proximate to the surface (2) of the component; and regulating the particle emission apparatus to (i) produce, for a specified time, at least one pulse having a thermal energy profile that includes thermal energy levels above and below the specified treatment level (7) and a maximum (5*a*) thermal energy level above the specified treatment level, (ii) localize the thermal energy levels above the specified treatment level (7) in at least one zone (6) that is a distance from the surface (2) and in the depth, (iii) localize the thermal energy levels below the specified treatment level (7) between the surface (2) and the at least one zone (6), wherein, the location of the at least one zone (6) is determined by the location in the depth of the thermal energy levels above the specified treatment level (7), the component is weakened in the at least one zone (6), and the component is not weakened between the surface (2) and the at least one zone (6).

45. The process of claim 44, wherein the specified thermal energy level corresponds to a specified temperature.

46. The process of claim 44, wherein the at least one zone comprises silicon as a constituent material and impurities selected from the group consisting of aluminium, bismuth, gallium, indium, antimony, tin, and combinations thereof.

47. The process of claim 44, wherein the constituent material of the at least one zone comprises silicon-germanium.

* * * * *